United States Patent
Grünwald et al.

(10) Patent No.: US 9,644,868 B2
(45) Date of Patent: May 9, 2017

(54) COMBINED INTAKE AND EXHAUST MANIFOLD FOR A THERMOELECTRIC TEMPERATURE CONTROL DEVICE

(71) Applicant: MAHLE Behr GmbH & Co. KG, Stuttgart (DE)

(72) Inventors: Jürgen Grünwald, Ludwigsburg (DE); Stefan Hirsch, Stuttgart (DE)

(73) Assignee: MAHLE Behr GmbH & Co. KG, Stuttgart (DE)

(*) Notice: Subject to any disclaimer, the term of this patent is extended or adjusted under 35 U.S.C. 154(b) by 206 days.

(21) Appl. No.: 14/703,227

(22) Filed: May 4, 2015

(65) Prior Publication Data

US 2015/0316299 A1 Nov. 5, 2015

(30) Foreign Application Priority Data

May 5, 2014 (DE) .................. 10 2014 208 362

(51) Int. Cl.
| | |
|---|---|
| *F25B 21/02* | (2006.01) |
| *H01L 35/28* | (2006.01) |
| *F28F 9/02* | (2006.01) |
| *F28F 9/22* | (2006.01) |
| *H01M 10/6572* | (2014.01) |
| *H01M 10/617* | (2014.01) |
| *H01M 10/625* | (2014.01) |
| *F28D 21/00* | (2006.01) |

(52) U.S. Cl.
CPC ............ *F25B 21/02* (2013.01); *F28F 9/0202* (2013.01); *F28F 9/22* (2013.01); *H01L 35/28* (2013.01); *H01M 10/617* (2015.04); *H01M 10/6572* (2015.04); *F28D 2021/0043* (2013.01); *H01M 10/625* (2015.04)

(58) Field of Classification Search
CPC ................................. F25B 21/02; H01L 35/30
USPC ..................... 62/3.2, 3.3, 3.6, 3.61, 3.7, 239
See application file for complete search history.

(56) References Cited

U.S. PATENT DOCUMENTS

| | | | | |
|---|---|---|---|---|
| 3,423,249 A | * | 1/1969 | Ross | .................. F23C 99/00 136/212 |
| 2016/0313390 A1 | * | 10/2016 | Barabi | ............... G01R 31/2874 |

FOREIGN PATENT DOCUMENTS

| | | |
|---|---|---|
| CA | 2771874 A1 | 3/2011 |
| DE | 19810185 C1 | 10/1999 |
| DE | 102012206127 A1 | 10/2013 |
| DE | 102012211259 A1 | 1/2014 |
| DE | 102012110702 A1 | 5/2014 |
| EP | 0952017 A2 | 10/1999 |

* cited by examiner

*Primary Examiner* — Melvin Jones
(74) *Attorney, Agent, or Firm* — Brinks Gilson & Lione (57) ABSTRACT

A combined intake and exhaust manifold (1) for a thermoelectric temperature control device includes an outer manifold case (2) that partially encases a first case interior (3), and an inner manifold case (4) provided in the first case interior (3), which partially encases a second case interior (5). The outer and the inner manifold cases (2, 4) have a joint connection side (6) for connecting a fluid line (17a, 17b). The manifold further includes at least one first flow-through opening (7a, 7b) for introducing or discharging a fluid into or out of the first case interior (3) and at least one second flow-through opening (8a, 8b) for introducing or discharging the fluid into or out of the second case interior (5) on the connection side (6).

18 Claims, 5 Drawing Sheets

COMBINED INTAKE AND EXHAUST MANIFOLD FOR A THERMOELECTRIC TEMPERATURE CONTROL DEVICE

TECHNICAL FIELD

The invention relates to a combined intake and exhaust manifold for a thermoelectric temperature control device as well as a thermoelectric temperature control device with such a combined intake and exhaust manifold. The invention further relates to a temperature control arrangement with at least one such thermoelectric temperature control device as well as a motor vehicle with at least one such temperature control arrangement.

BACKGROUND

In modern hybrid and electric motor vehicles lithium ion batteries are frequently used as rechargeable energy stores. A battery optimized with regard to service life and maximum energy storage amount requires a corresponding high-performance temperature control device for the individual battery cells, which is capable of preventing in particular heating of the battery beyond a maximum operating temperature.

The heating and cooling power made available by the temperature control device should be distributed as evenly as possible to the individual battery cells of the lithium ion battery precisely during the tempering of lithium ion batteries. If the tempering is carried out via a heating or cooling plate to which the battery cells are thermally connected via surface contact, this creates the need for an almost completely homogeneous plate temperature. If the plate is directly or indirectly tempered with the aid of a fluid acting as heating or cooling agent, optionally in combination with Peltier elements, then the inlet temperature of the fluid in the temperature control device is different from the outlet temperature, since the fluid has absorbed heat in the case of cooling and has released heat in the case of a heating. From this it follows, however, with homogeneous heat transfer coefficients from fluid to battery, that the battery cells to be tempered do not undergo a spatially uniform heat supply or dissipation and are thus not homogeneously tempered.

Against this background, cooling systems are known from the prior art that allow heat exchange between the battery and the cooling plates via two cooling plates configured as half shells that form a cooling agent channel for a cooling agent when attached to each other, wherein the enthalpy of evaporation of the battery required for evaporation of the fluid cooling agent is extracted in the form of heat. If a merely single-phase cooling agent is used, that is, one that is available only in liquid form, the heat exchange can then be supported by thermoelectric elements, for instance in the form of Peltier elements, which are mounted at defined points between the battery to be cooled and the cooling plates.

One possibility for counteracting the undesirable effect of spatially inhomogeneous tempering of the battery cells is to achieve an on average homogeneous distribution of the fluid temperature via adjacent fluid channels with alternating flow direction between two ends of a plate. A combined intake and exhaust manifold is provided on the temperature control device in such a scenario. The fluid is introduced into the manifold via a fluid inlet and is there distributed to the different adjacent fluid channels with the aid of suitable direction-defining structures, through which the thermal interaction of the fluid with the battery cells can take place. After flowing through the fluid channels, the fluid flows back again into the intake and exhaust manifold and is channeled out of it through a joint fluid outlet. DE 10 2012 211 259 A1, which is known from the prior art, discloses an intake and exhaust manifold that operates according to this principle.

However, such an application necessarily presupposes a design of the intake and exhaust manifold with three-dimensional flow structures, resulting in markedly higher manufacturing costs for the production of the intake and exhaust manifold.

It is therefore an object of the invention to create a combined intake and exhaust manifold that has a simply designed configuration and in which the above-mentioned disadvantages are no longer present.

SUMMARY OF THE INVENTION

This object is attained by the basic idea to equip a combined intake and exhaust manifold with an outer and an inner manifold case, wherein the inner manifold case is arranged inside the outer manifold case and both manifold cases have a joint connection side for connecting fluid lines. At least one flow-through opening for introducing or discharging a fluid into or out of a first case interior is provided for this purpose on the connection side. At least one second flow-through opening serves for introducing or discharging the fluid into or out of the second case interior.

The approach presented here allows implementation of the above-mentioned tempering principle of the battery cells with the aid of fluid lines in a mutually adjacent arrangement, through which a fluid flows alternately in opposite directions, without having to equip the intake and exhaust manifold with three-dimensional flow structures. The combined intake and exhaust manifold according to the invention presented here rather allows the connection of all fluid lines required for the tempering of the battery cells at the connection side. A complex design of the intake and exhaust manifold with three-dimensional fluid line structures, which is known from the prior art, is not necessary.

Considerable cost advantages are obtained for production as a result of the structurally simple design of the intake and exhaust manifold presented here, which is basically formed by the two manifold cases. The plastic injection molding process in particular might be considered here for production of the presented manifold case, which means that technically laborious soldering processes can be avoided for production of the manifold. The concept presented herein furthermore allows implementation of the intake and exhaust manifold according to the invention with a low net weight.

A combined intake and exhaust manifold for a thermoelectric temperature control device according to the invention comprises an outer manifold case that partially encases a first case interior as well as an inner manifold case provided in the first case interior, which in turn partially encases a second case interior. The two manifold cases have a joint connection side for connection of a respective fluid line. At least one first flow-through opening for introducing or discharging a fluid into or out of the first case interior is provided on that connection side according to the invention. At least one second flow-through opening, which is likewise provided on the connection side, allows the introduction or discharge of a fluid into or out of the second case interior.

The fluid is supplied through the first flow-through opening via the outer manifold case that serves, for example, as intake manifold, to the fluid line that is connected to the opening, where it is subjected to thermal interaction with the components to be tempered, for instance the already mentioned battery cells. The fluid can then pass into a further fluid line and flow back in it to the combined intake and exhaust manifold with the aid of a deflection manifold, which like the fluid line is not part of the combined intake and exhaust manifold. The connection of this fluid line to the second flow-through opening makes it possible for the fluid to flow into the inner manifold case, which serves as an exhaust manifold. The inner manifold case can also be used as an intake manifold and the outer manifold case can accordingly be used as an exhaust manifold.

In a preferred embodiment, the joint connection side can have a joint connection wall, in which the first and the second flow-through opening are provided. This means that the connection side must not necessarily be configured as fully open, but can be formed by a connection wall in which the flow-through openings are provided.

In an alternative embodiment it is proposed that the connection side of the two case walls be provided with an open configuration. This means that the flow-through openings are delimited exclusively by outer case walls of the outer manifold case and inner case walls of the inner manifold case, which are not part of the connection side.

For an open configuration of the connection side it is recommended according to another preferred embodiment that the second flow-through opening also be delimited toward the outside, toward the first case interior, exclusively via inner case walls of the inner manifold case.

Different options are established for the person skilled in the art with regard to the geometry of the two manifold cases. A fundamentally cuboid geometric shape is recommended if the manifold cases are to be produced with an injection molding process. Each of the two manifold cases then comprises in cross section two inner and outer case walls, which are respectively orthogonally arranged with reference to the connection side or connection wall. Furthermore they have each an inner and an outer case wall, which faces the connection side or the connection wall.

As an alternative thereto, an embodiment is to be considered preferred in which the mentioned cuboid geometry, which presupposes the configuration of several case walls with edges between adjacent walls, is replaced by a geometric shape with a reduced number of edges. In this embodiment, the outer manifold case has an outer manifold wall, which faces the connection side or the connection wall and has the geometry of a segment of a circle in the cross section of the intake and exhaust manifold. The inner manifold case accordingly has an inner manifold wall that faces the connection side or the connection wall, which likewise has the geometry of a segment of a circle in the cross section of the combined intake and exhaust manifold.

The invention furthermore relates to a thermoelectric temperature control device, in particular for a power supply unit of a motor vehicle, with a combined intake and exhaust manifold as well as a deflection manifold that is fluidically connected thereto. The temperature control device additionally comprises a first fluid line, which is arranged on the connection side in such a way that the first flow-through opening is in fluidic connection with the second flow-through opening via the first fluid line and the deflection manifold. The temperature control device similarly comprises a second fluid line, which is arranged in such a way on the connection side that the first flow-through opening is in fluidic connection with the second flow-through opening via the second fluid line and the deflection manifold.

The two fluid lines can each be particularly effectively arranged to be mutually adjacent in a joint longitudinal direction and with reference to a transversal direction running transversely to the longitudinal direction. This implies that the combined intake and exhaust manifold is arranged on a first longitudinal end of the two fluid lines with reference to the longitudinal direction. The deflection manifold is mounted on a second longitudinal end of the two fluid lines, which faces the first longitudinal end. Such an arrangement requires particularly little installation space.

In an embodiment that is particularly easy to produce, it is proposed that a separator be provided that extends in the longitudinal direction in each of the two fluid lines between the first and the second line section. The latter divides the fluid line in the transverse direction into a first and a second line section, both of which consequently likewise extend in the longitudinal direction. The fluid connection between the two line sections is produced in this way via the deflection manifold. According to this embodiment, the first line section of the first fluid line fluidically communicates with the first flow-through opening of the combined intake and exhaust manifold as well as with the deflection manifold, and the second line section of the first fluid line fluidically communicates with the second flow-through opening of the combined intake and exhaust manifold as well as with the deflection manifold. The first line section of the second fluid line similarly fluidically communicates with the second flow-through opening of the combined intake and exhaust manifold as well as with the deflection manifold, and the second line section of the second fluid line fluidically communicates with the first flow-through opening of the combined intake and exhaust manifold as well as with the deflection manifold.

For a particularly space-saving structural implementation of the previously described arrangement of the fluid lines and their two line sections relative to the intake and exhaust manifold as well as the deflection manifold, it is recommended that the two fluid lines be configured as separate flat tubes, which are arranged side by side in the transversal direction. Alternatively, however, the two fluid lines may conceivably be in the form of a single flat tube. The then required fluidic distribution into the first and second fluid line may be implemented via a flat tube partition wall extending in the longitudinal direction. The latter can be molded as an integral part of the flat tube.

The separator that divides the two fluid lines into the first and second line section can be configured especially effectively in the manner of a fluid-tight partition wall.

The fluid lines can be equipped with Peltier elements in order to improve the heat exchange between the fluid flowing through the fluid lines and the component to be tempered, for instance the battery cells. If a direction running orthogonally with reference to the longitudinal and transversal direction is defined as the "vertical direction," then the Peltier elements—at least two such Peltier elements are required, but a variant with a plurality of such Peltier elements is especially effective—can be arranged on a tube wall that delimits the first fluid line in the vertical direction. An arrangement of the elements in the longitudinal direction and spaced from each other is likewise recommended here. This likewise applies, mutatis mutandis, for the second fluid line.

If the combined intake and exhaust manifold is viewed in a flow plane defined by the longitudinal and transversal directions of the fluid lines, then an embodiment in which the combined intake and exhaust manifold has a fundamentally U-shaped profile in the flow plane may be considered as particularly preferred.

Production cost advantages are obtained if the combined intake and exhaust manifold and the deflection manifold are configured as a unit. It is recommended for this purpose to make available a receiving device for accommodating the fluid lines in a plane defined by the longitudinal and transversal direction between the two manifolds, wherein the combined intake and exhaust manifold and the deflection manifold are both molded as integral parts on the receiving arrangement.

In an advantageous further development, it is proposed that the receiving arrangement be configured with an especially trough-like surface geometry that complements the fluid lines. The flat tube that forms the fluid lines can then be almost "fitted" in such a trough-like receiving arrangement. This applies also for the case in which each of the two fluid lines is formed by a separate flat tube.

Further cost advantages are obtained if the combined intake and exhaust manifold, the receiving arrangement, and the deflection manifold are produced from plastic, in particular by an injection molding process.

The invention furthermore concerns a temperature control arrangement with at least one electric power supply unit, in particular a rechargeable battery, as well as a temperature control device thermally coupled for temperature control to the electric power supply unit having one or several of the aforementioned features.

The invention finally relates to a motor vehicle having at least one such temperature control arrangement.

Other important features and advantages of the invention derive from the dependent claims, the drawings, and the corresponding description of the figures based on the drawings.

It is understood that the previously mentioned features and those yet to be described below need not be used in the respectively disclosed combination, but also in other combinations or on their own, without abandoning the scope of the present invention.

Preferred exemplary embodiments of the invention are represented in the drawings and are explained in more detail in the following description, wherein the same reference numerals refer to the same or similar or functionally equivalent components.

BRIEF DESCRIPTION OF THE DRAWINGS

In the enclosed schematic drawings.

DETAILED DESCRIPTION OF THE DRAWINGS

Figure 1:
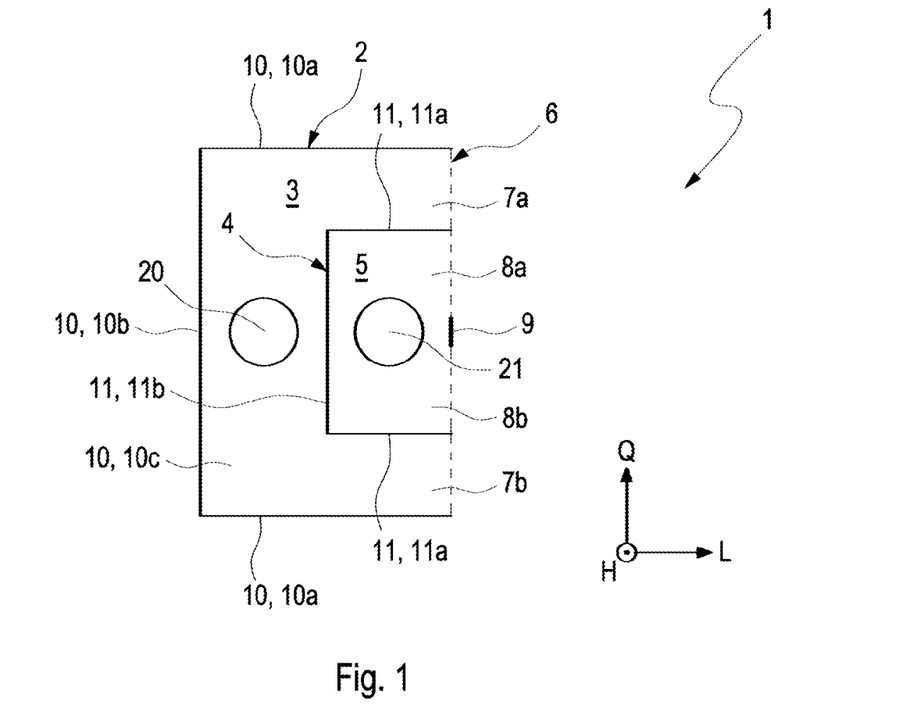
FIG. 1 shows an example of a combined manifold according to the invention depicted in cross section.

FIG. 1 illustrates an example of a combined intake and exhaust manifold 1 according to the invention—identified in the following as "manifold" 1 for reasons of simplification—for a thermoelectric temperature control device in roughly schematic representation and in a cross section perpendicular to the vertical direction H of the manifold 1. The latter comprises an outer manifold case 2, which partially encases a first case interior 3. An inner manifold case 4, which in turn partially encases a second case interior 5, is arranged in the first case interior 3. Both outer and inner manifold cases 2, 4 have a joint connection side 6 for the connection of fluid lines that are not depicted in FIG. 1.

Figure 2:
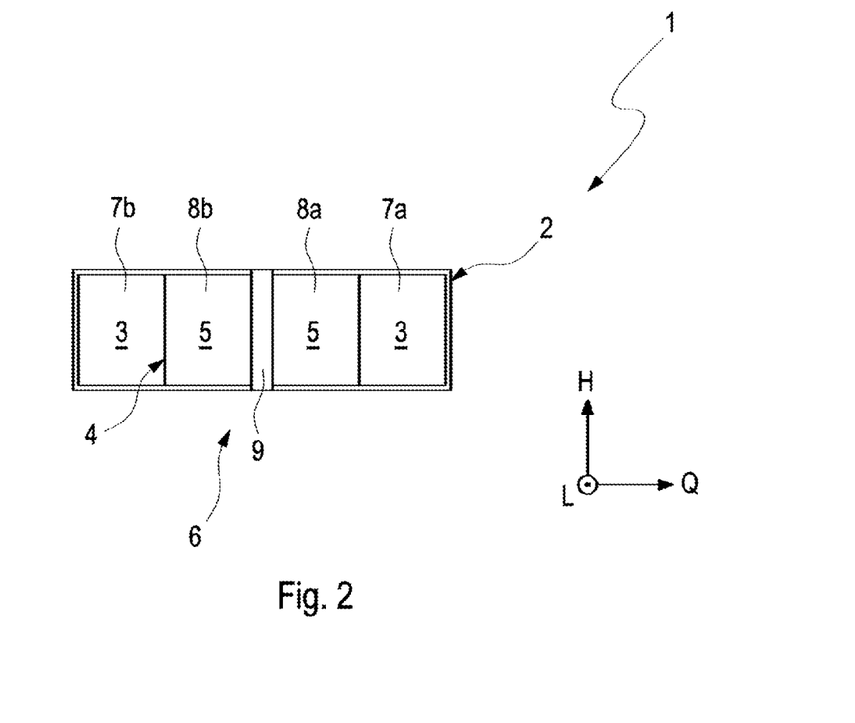
FIG. 2 shows a variant of the example of FIG. 1.

As can be seen in FIG. 1, two first flow-through openings 7a, 7b for introducing and discharging a fluid into or out of the first case interior 4 and two second flow-through openings 8a, 8b for introducing and discharging a fluid into or out of the second case interior 5 are provided on the connection side 6. FIG. 2 shows for clarification a plan view of the connection side 6 in a longitudinal direction L of the manifold 1, which runs orthogonally with respect to the vertical direction H.

It is apparent that a ridge 9 is provided on the connection side 6, which separates the two second flow-through openings 8a, 8b from one another. Such a ridge 9 can also be omitted in one variant, however. In this case the flow-through openings 7a, 7b, 8a, 8b present on the connection side 6 are exclusively delimited by outer case walls 10 of the outer manifold case 2 and inner case walls 11 of the inner manifold case 4.

Figure 3:
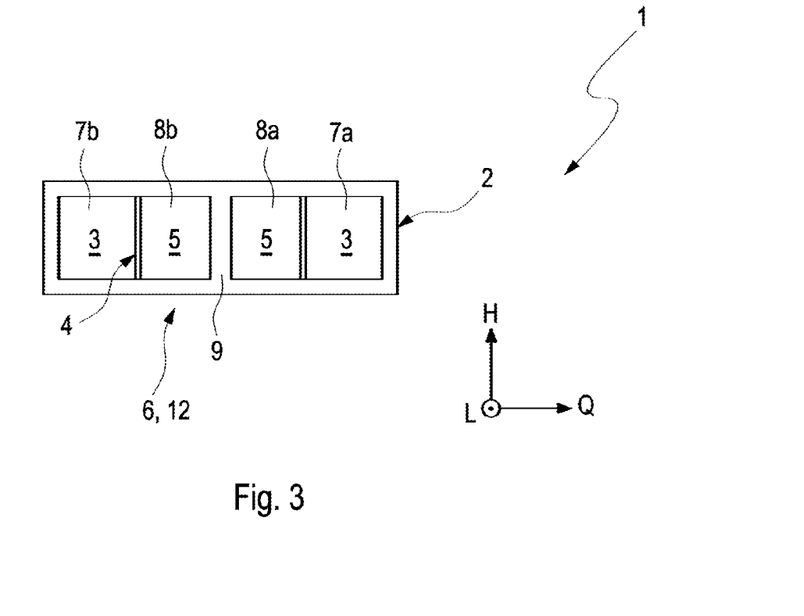
FIG. 3 shows a plan view of the connection side of the manifold of FIGS. 1 and 2.

FIG. 3 illustrates, in contrast, a variant of the manifold 1 of FIGS. 1 and 2 in which the joint connection side 6 has a joint connection wall 12, in which the first and second flow-through openings 7a, 7b, 8a, 8b are provided. The ridge 9 can also be omitted in the example of FIG. 2.

Upon further observation of the representation of FIGS. 1 and 2 it can be determined that the second flow-through openings 8a, 8b are delimited on the outside, toward the first case interior 3, via inner case walls 11 of the inner manifold case 4. As graphically documented in FIG. 1, the two manifold cases 2, 4 can each have a fundamentally cuboid geometrical shape. This means that the manifold cases 2, 4 respectively comprise two inner and outer case walls 11a, 10a in the cross section represented in FIG. 1, which are respectively arranged at a right angle to the connection side 6 or connection wall 12 (see also FIG. 3 in this regard). A further inner or outer case wall 11b, 10b is arranged opposite the connection side 6 or connection wall 12.

Figure 4:
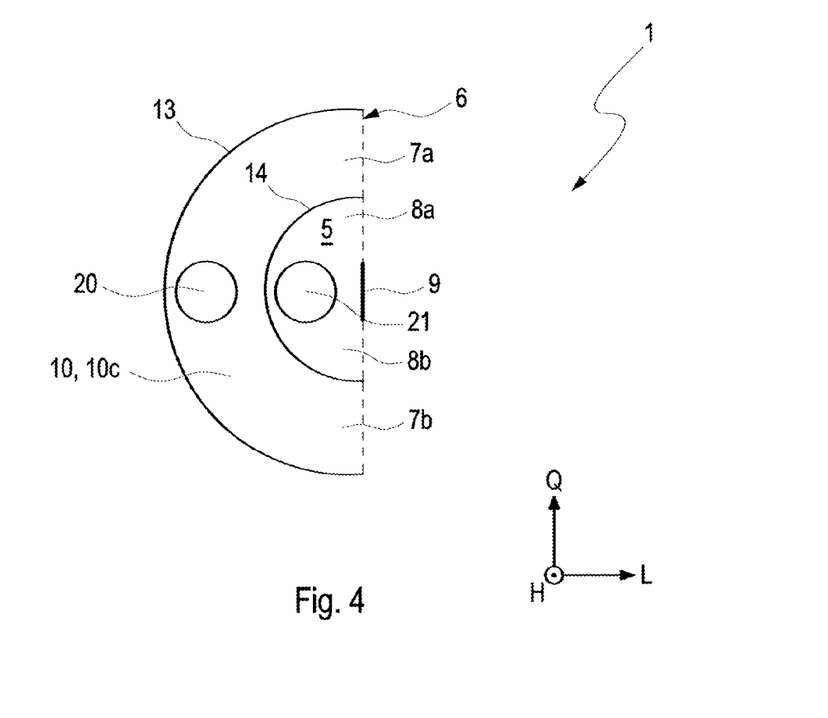
FIG. 4 shows a variant of the example of FIG. 3.

In contrast, FIG. 4 illustrates a variant in which the outer manifold case 2 has an outer manifold wall 13, which faces the connection side 6 or the connection wall 12 and has the geometry of a segment of a circle in the cross section of the combined intake and exhaust manifold 1 shown in FIG. 4. The inner manifold case 4 accordingly also has an inner manifold wall 14, which faces the connection side 6 or connection wall 12 and likewise has the geometry of a segment of a circle in the cross section of the combined intake and exhaust manifold 1.

Figure 5:
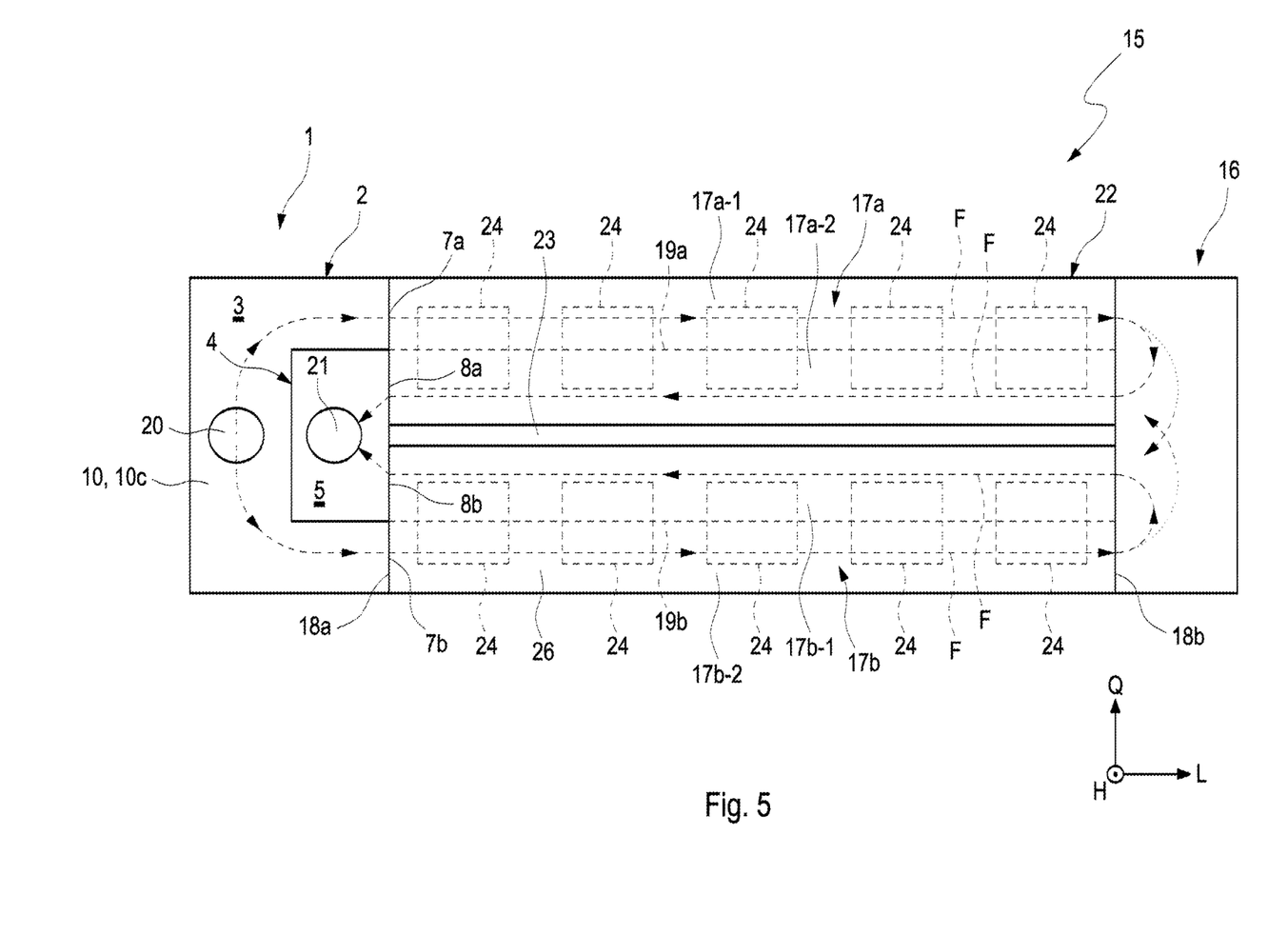
FIG. 5 shows an example of a thermoelectric temperature control device according to the invention.

Reference is now made to the representation of FIG. 5, which likewise shows a cross section of the previously discussed combined intake and exhaust manifold 1 as part of a thermoelectric temperature control device 15 for a power supply unit of a motor vehicle. In addition to the combined intake and exhaust manifold 1, the temperature control unit 15 also comprises a deflection manifold 16, which fluidically communicates with the manifold 1 via a first fluid line 17a and a second fluid line 17b. It can be seen that the two fluid lines 17a, 17b respectively extend in a joint longitudinal direction L, which corresponds to the longitudinal direction L of the manifold 1. They are arranged next to each other with reference to a transversal direction Q that runs transversely to the longitudinal direction L. The combined intake and discharge manifold 1 is arranged on a first longitudinal end 18a of the two fluid lines 17a, 17b with reference to the longitudinal direction L, while the deflection manifold 16 is arranged on a second longitudinal end 18b of the two fluid lines 17a, 17b that faces the first longitudinal end 18a. If a flow plane for the fluid that flows through the fluid lines 17a, 17b is defined by the longitudinal and transversal directions L and Q, then the combined intake and exhaust manifold 1 has a fundamentally U-shaped profile in the flow plane, which corresponds to the plane of the drawing in the figures.

A separator 19a, 19b that extends in the longitudinal direction L and is shown by a broken line in FIG. 5 is furthermore provided in each of the two fluid lines 17a, 17b. The separator 19a, 19b respectively divides the two fluid lines 17a, 17b in the transversal direction Q into a first and a second line section 17a-1, 17a-2, 17b-1, 17b-2, both of which extend in the longitudinal direction L and are fluidically separated from each other via the separator 19a, 19b. The first line section 17a-1 of the first fluid line 17a fluidically communicates thereby via the deflection manifold 16 with the second line section 17a-2. The same applies, mutatis mutandis, to the two line sections 17b-1 and 17b-2 of the second fluid line 17b.

The separators 19a, 19b can be configured so as to be fluid-tight, but can also be configured so as to be permeable to fluids, as represented in FIG. 5 by a broken line of the partition walls 19a, 19b.

The first line section 17a-1 of the first fluid line 17a fluidically communicates with the first flow-through opening 7a of the combined intake and exhaust manifold 1; the second line section 17a-2 of the first fluid line 7a fluidically communicates with the second flow-through opening 8a. The first line section 17b-1 of the second fluid line 17b likewise fluidically communicates with the second flow-through opening 8b of the combined intake and exhaust manifold 1, and the second line section 17a-2 of the second fluid line 7b fluidically communicates with the first flow-through opening 7b. This means that the first fluid line 17a is arranged in such a way on the connection side 6 of the manifold 1 that the first flow-through opening 7a is in fluid connection with the deflection manifold 16 via the first line section 17a-1 and the deflection manifold 16 is in fluid connection with the second flow-through opening 8a of the manifold via the second line section 17a-2. The same applies to the second fluid line 17b. The latter is consequently arranged in such a way on the connection side 6 that the first flow-through opening 7b is in fluid connection with the deflection manifold 16 via the second line section 17b-2 of the second fluid line 17b and the deflection manifold 16 is in fluid connection with the second flow-through opening 8b via the first line section 17b-1 of the second fluid line 17b.

The fluid paths implemented between the intake and exhaust manifold 1 and the deflection manifold with the aid of the two fluid lines 17a, 17b will be described in more detail below. However, first again note the manifold 1 shown in FIGS. 1, 4, and 5. It is apparent that a fluid inlet 20 that fluidically communicates with the outer manifold case 2 and a fluid outlet 21 that fluidically communicates with the inner manifold case 4 can be provided on a case wall 10c that delimits the manifold 1 in vertical direction H. The fluid inlet 20 and fluid outlet 21 can also be substituted in a variant of the example.

As shown in FIG. 5, a fluid F can thus be introduced into the outer manifold case 2 via the fluid inlet 20. From there it flows into the deflection manifold 16, either through the first line section 17a-1 of the first fluid line 17a or through the second line section 17b-2 of the second fluid line 17b. From the deflection manifold 16, the fluid F can flow back into the inner manifold case 4 of the manifold 1, either through the second line section 17a-2 of the first fluid line 17a or through the first line section 17b-1 of the second fluid line 17b, and can leave the manifold 1 again via the fluid outlet 21.

With regard to the technical implementation of the two fluid lines 17a, 17b, a person skilled in the art has a multitude of options from which he may chose on the basis of application-specific viewpoints. Here a variant is particularly recommended in which the two fluid lines 17a, 17b are configured as separate flat tubes (not shown). Shown to be especially effective is the variant in the figures in which the two fluid lines 17a, 17b are arranged in a joint flat tube 22 and are fluidically separated from each other via a flat tube partition wall 23, which extends in the longitudinal direction L. The flat tube partition wall 23 can be molded as an integral part of the flat tube. The thermal coupling of the fluid with the component to be cooled takes place in the area of the fluid lines 17a, 17b, as will be explained in more detail in the following.

As illustrated in FIG. 5, a vertical direction H of the flat tube 22 is defined by a direction running orthogonally to the longitudinal and transversal directions L, Q. It is apparent that the fluid lines 17a, 17b are equipped with several Peltier elements 24 in order to improve the heat exchange between the fluid that flows through the fluid lines 17a, 17b and the component to be tempered, for instance the battery cells. The Peltier elements 24 can be arranged on a tube wall 26, which delimits the flat tube 22 in the vertical direction H. An adjacent arrangement of the Peltier elements 24 in the longitudinal direction L as well as in the area of the first and also the second fluid line 17a, 17b is hereby recommended. The arrangement of the Peltier elements 24 in two rows in the longitudinal direction L shown in FIG. 5 is thus obtained. Using the figures, five such Peltier elements 24 are shown by way of example; it is clear that a different number is possible in variants of the example. Recesses (not shown), which complement the Peltier elements 24 and into which the Peltier elements 24 are inserted, can be provided on the tube wall 26 to accommodate the Peltier elements. The component to be tempered by the temperature control device 15, in particular an electric power supply unit in the form of a rechargeable battery, can be arranged on the tube wall 26, so that the thermal coupling of the fluid flowing through the fluid lines 17a, 17b of the flat tube 23 for tempering of the component—which ideally fits flatly against the tube wall 26—can be effected precisely via this tube wall 26. The power supply unit may, for example, have the same length and width as the flat tube 22 and is not shown separately in FIGS. 5 and 6.

Figure 6:
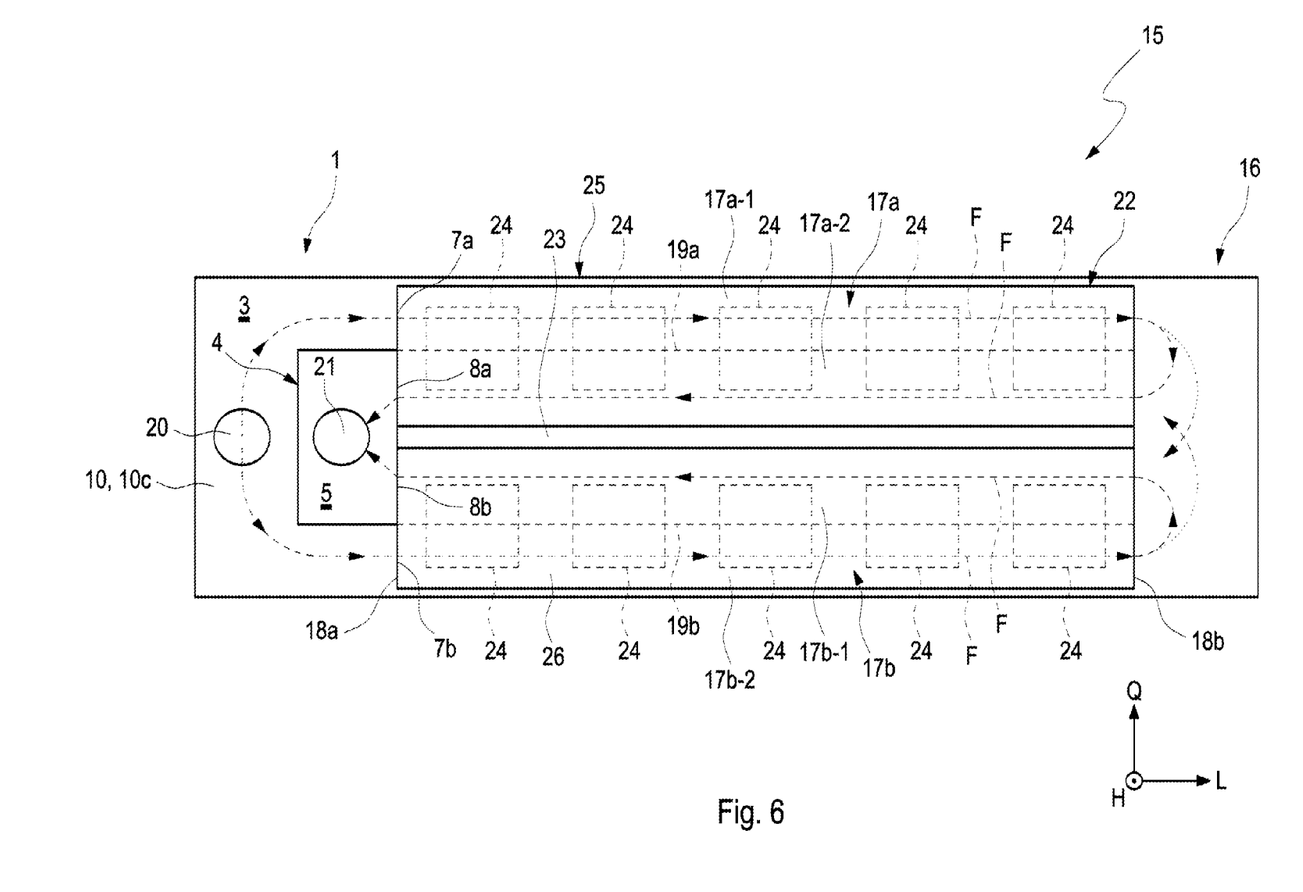
FIG. 6 shows a variant of the example of FIG. 5.

FIG. 6 shows a variant of the temperature control unit 15 of FIG. 5, in which the two manifolds 1, 16 are configured as a structural unit. The combined intake and exhaust manifold 1 accordingly merges into the deflection manifold 16 in the longitudinal direction L via a receiving device 25 to accommodate the flat tube 22, including the fluid lines 17a, 17b. The combined intake and exhaust manifold 1 and the deflection manifold 16 are both molded as integral parts on the receiving device 25. In other words, the manifold 1, the receiving device 25, and the deflection manifold 16 form a unit, which can be economically produced from plastic, for example, by an injection molding process. Labor-intensive soldering of the individual components is omitted in this variant. Considerable cost advantages can be obtained from this. To accommodate the flat tube 22, the receiving device 25 preferably has a surface geometry that complements the flat tube 22. It is therefore recommended that the receiving device be configured roughly in the manner of a receiving trough.

Figure 7:
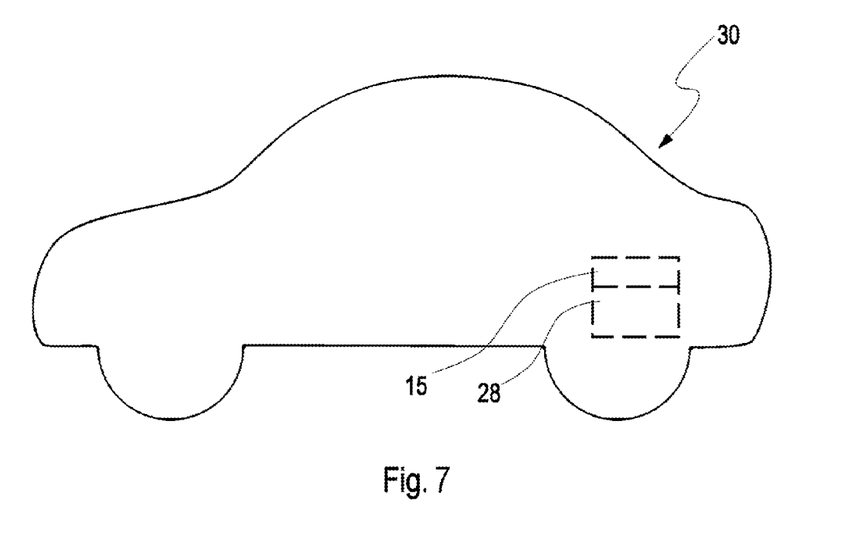
FIG. 7 schematically shows a vehicle with a power supply unit and a thermoelectric temperature control device.

Finally, FIG. 7 schematically shows a vehicle 30 with a power supply unit 28 cooled by a temperature control unit 15.

While the above description constitutes the preferred embodiments of the present invention, it will be appreciated that the invention is susceptible to modification, variation and change without departing from the proper scope and fair meaning of the accompanying claims.

What is claimed is:

1. A combined intake and exhaust manifold (1) for a thermoelectric temperature control device, comprising:
    an outer manifold case (2) that partially encases a first case interior (3), and
    an inner manifold case (4) provided in the first case interior (3), which partially encases a second case interior (5),
    wherein the outer and the inner manifold cases (2, 4) have a joint connection side (6) for connecting a fluid line (17a, 17b),
    wherein two first flow-through openings (7a, 7b) are provided on the connection side (6), the two flow-through opening (7a, 7b) adapted at least for introducing a fluid into the first case interior (3) or for discharging the fluid out of the first case interior (3), and
    wherein at least one second flow-through opening (8a, 8b) at least for introducing the fluid into the second case interior (5) or for discharging the fluid out of the second case interior (5) is provided on the connection side (6),
    wherein the two first flow-through openings (7a, 7b) and the at least one second flow-through opening (8a, 8b) are arranged in a common flow plane, the at least one second flow-through opening being located between the two first flow-through openings (7a, 7b) and separating the two first flow-through openings from each other.

2. The combined intake and exhaust manifold according to claim 1,
    wherein the joint connection side (6) has a joint connection wall (12), in which the first and second flow-through openings (7a, 7b, 8a, 8b) are provided.

3. The combined intake and exhaust manifold according to claim 2,
    wherein the outer and inner manifold cases (2, 4) have a substantially cuboid geometric shape,
    wherein the outer and inner manifold cases (2, 4) include respectively two outer and inner case walls (10a, 11a), which are respectively arranged orthogonally to the connection side (6) or to the connection wall (12) in a cross section of the combined intake and exhaust manifold (1), and
    wherein the two manifold cases (2, 4) have respectively an outer and an inner case wall (10b, 11b), which face the connection side (6) or the connection wall (12) in the cross section.

4. The combined intake and exhaust manifold according to claim 2,
    wherein the outer manifold case (2) has an outer manifold wall (13), which faces the connection side (6) or the connection wall (12) and has the geometry of a segment of a circle in the cross section of the combined intake and exhaust manifold (1), and
    wherein the inner manifold case (4) has an inner manifold wall (14), which faces the connection side (6) or the connection wall (12) and has the geometry of a segment of a circle in the cross section of the combined intake and exhaust manifold (1).

5. The combined intake and exhaust manifold according to claim 1,
    wherein the two first flow-through openings (7a, 7b) are delimited exclusively via outer case walls (10a, 10b, 10c, 13) of the outer manifold case (2) and via inner case walls (11a, 11b, 14) of the inner manifold case (4), which are not part of the connection side (6).

6. The combined intake and exhaust manifold according to claim 1,
    wherein the at least one second flow-through opening (8a, 8b) is delimited on the outside, toward the first case interior (3), exclusively via inner case walls (11a, 11b) of the inner manifold case (4).

7. A thermoelectric temperature control device (15) for a power supply unit of a motor vehicle, comprising:
    a combined intake and exhaust manifold (1) having
        an outer manifold case (2) that partially encases a first case interior (3), and
        an inner manifold case (4) provided in the first case interior (3), which partially encases a second case interior (5),
        wherein the outer and the inner manifold cases (2, 4) have a joint connection side (6) for connecting a fluid line (17a, 17b),
        wherein two first flow-through openings (7a, 7b) are provided on the connection side (6), the two flow-through opening (7a, 7b) adapted at least for introducing a fluid into the first case interior (3) or for discharging the fluid out of the first case interior (3), and
        wherein at least one second flow-through opening (8a, 8b) at least for introducing the fluid into the second case interior (5) or for discharging the fluid out of the second case interior (5) is provided on the connection side (6),
        wherein the two first flow-through openings (7a, 7b) and the at least one second flow-through opening (8a, 8b) are arranged in a common flow plane, the at least one second flow-through opening being located between the two first flow-through openings (7a, 7b) and separating the two first flow-through openings from each other,
    a deflection manifold (16) that fluidically communicates therewith,
    a first fluid line (17a), which is arranged on the connection side (6) in such a way that the first flow-through opening (7a) is in fluid connection with the second flow-through opening (8a) via the first fluid line (17a) and the deflection manifold (16), and
    a second fluid line (17b), which is arranged on the connection side (6a) in such a way that the first flow-through opening (7b) is in fluid connection with the second flow-through opening (8b) via the second fluid line (17b) and the deflection chamber (16).

8. The thermoelectric temperature control device according to claim 7,
    wherein the two fluid lines (17a, 17b) respectively extend in a joint longitudinal direction (L) and are fluidically separated and arranged adjacent to each other with reference to a transversal direction (Q) that runs transversely to the longitudinal direction (L), wherein the combined intake and exhaust manifold (1) is arranged on a first longitudinal end (18a) of the two fluid lines (17a, 17b) with reference to the longitudinal direction (L), and wherein the deflection manifold (16) is mounted on a second longitudinal end (18b) of the two fluid lines (17a, 17b), which faces the first longitudinal end (18a) in the longitudinal direction (L).

9. The thermoelectric temperature control device according to claim 7, wherein a separator (19a, 19b), which extends in the longitudinal direction (L) is provided in each of the two fluid lines (17a, 17b) and divides the fluid line (17a, 17b) in the transversal direction (Q) into a first and a second line section (17a-1, 17a-2, 17b-1, 17b-2), both of which extend in a longitudinal direction (L), wherein the first line section (17a-1, 17b-1) fluidically communicates with the second line section (17a-2, 17b-2) assigned thereto via the deflection manifold (16), wherein the first line section (17a-1) of the first fluid line (17a) fluidically communicates with the first flow-through opening (7a) of the combined intake and exhaust manifold (1) and the deflection manifold (16) and the second line section (17a-2) of the first fluid line (17a) fluidically communicates with the second flow-through opening (8a) of the combined intake and exhaust manifold (1) and the deflection manifold (16), and wherein the first line section (17b-1) of the second fluid line (17b) fluidically communicates with the second flow-through opening (8b) of the combined intake and exhaust manifold (1) and the deflection manifold (16) and the second line section (17b-2) of the second fluid line (17b) fluidically communicates with the first flow-through opening (7b) of the combined intake and exhaust manifold (1) and the deflection manifold (16).

10. The thermoelectric temperature control device according to claim 7, wherein the two fluid lines (17a, 17b) are configured as separate flat tubes, or wherein the two fluid lines (17a, 17b) are arranged in a joint flat tube (22) and are fluidically separated from each other via a flat tube partition wall (23), which extends in a longitudinal direction (L).

11. The thermoelectric temperature control device according to claim 7, wherein a vertical direction (H) of the flat tube (22) is defined by a direction that runs orthogonally to a longitudinal direction (L) and a transversal direction (Q), wherein at least two Peltier elements (24), preferably a plurality of Peltier elements (24), which are arranged at a distance with respect to each other in the longitudinal direction, are provided on one tube wall (26) that delimits the first fluid line (17a) in the vertical direction (H), and wherein at least two Peltier elements (24), preferably a multitude of Peltier elements (24), which are arranged at a distance with respect to each other in the longitudinal direction (L), are provided on a tube wall (26) that delimits the second fluid line (17b) in the vertical direction (H).

12. The thermoelectric temperature control device according to claim 7, wherein the flow plane for the fluid that flows through the fluid lines (17a, 17b) is defined by a longitudinal direction (L) and a transversal direction (Q), and wherein the combined intake and exhaust manifold (1) has a substantially U-shaped profile in the flow plane.

13. The thermoelectric temperature control device according to claim 7, wherein the combined intake and exhaust manifold (1) merges into the deflection manifold (16) in a longitudinal direction (L) via a receiving device (25) for accommodating the fluid lines (17a, 17b), and wherein the combined intake and exhaust manifold (1) and the deflection manifold (16) are both molded as integral parts on the receiving device (25).

14. The thermoelectric temperature control device according to claim 13, wherein the receiving device (25) has an especially trough-like surface geometry that is configured so as to complement the fluid lines (17a, 17b).

15. The thermoelectric temperature control device according to claim 13, wherein the combined intake and exhaust manifold (1), the receiving device (25), and the deflection manifold (16) are produced from plastic.

16. A temperature control arrangement, comprising:

at least one electric power supply unit (28) and a temperature control device (15), which is thermally coupled for tempering to the electric power supply unit, the temperature control device (15) including a combined intake and exhaust manifold (1) having an outer manifold case (2) that partially encases a first case interior (3), and an inner manifold case (4) provided in the first case interior (3), which partially encases a second case interior (5), wherein the outer and the inner manifold cases (2, 4) have a joint connection side (6) for connecting a fluid line (17a, 17b), wherein two first flow-through openings (7a, 7b) are provided on the connection side (6), the two flow-through opening (7a, 7b) adapted at least for introducing a fluid into the first case interior (3) or for discharging the fluid out of the first case interior (3), and wherein at least one second flow-through opening (8a, 8b) at least for introducing the fluid into the second case interior (5) or for discharging the fluid out of the second case interior (5) is provided on the connection side (6), wherein the two first flow-through openings (7a, 7b) and the at least one second flow-through opening (8a, 8b) are arranged in a common flow plane, the at least one second flow-through opening being located between the two first flow-through openings (7a, 7b) and separating the two first flow-through openings from each other, a deflection manifold (16) that fluidically communicates therewith, a first fluid line (17a), which is arranged on the connection side (6) in such a way that the first flow-through opening (7a) is in fluid connection with the second flow-through opening (8a) via the first fluid line (17a) and the deflection manifold (16), and a second fluid line (17b), which is arranged on the connection side (6a) in such a way that the first flow-through opening (7b) is in fluid connection with the second flow-through opening (8b) via the second fluid line (17b) and the deflection chamber (16).

17. The temperature control arrangement according to claim 16, wherein the at least one electric power supply unit (28) is a rechargeable battery.

18. A motor vehicle (30) comprising at least one temperature control arrangement including
- at least one electric power supply unit (28) and
- a temperature control device (15), which is thermally coupled for tempering to the electric power supply unit, the temperature control device (15) including
  - a combined intake and exhaust manifold (1) having
    - an outer manifold case (2) that partially encases a first case interior (3), and
    - an inner manifold case (4) provided in the first case interior (3), which partially encases a second case interior (5),
    - wherein the outer and the inner manifold cases (2, 4) have a joint connection side (6) for connecting a fluid line (17a, 17b),
    - wherein two first flow-through openings (7a, 7b) are provided on the connection side (6), the two flow-through opening (7a, 7b) adapted at least for introducing a fluid into the first case interior (3) or for discharging the fluid out of the first case interior (3), and
    - wherein at least one second flow-through opening (8a, 8b) at least for introducing the fluid into the second case interior (5) or for discharging the fluid out of the second case interior (5) is provided on the connection side (6),
    - wherein the two first flow-through openings (7a, 7b) and the at least one second flow-through opening (8a, 8b) are arranged in a common flow plane, the at least one second flow-through opening being located between the two first flow-through openings (7a, 7b) and separating the two first flow-through openings from each other,
  - a deflection manifold (16) that fluidically communicates therewith,
  - a first fluid line (17a), which is arranged on the connection side (6) in such a way that the first flow-through opening (7a) is in fluid connection with the second flow-through opening (8a) via the first fluid line (17a) and the deflection manifold (16), and
  - a second fluid line (17b), which is arranged on the connection side (6a) in such a way that the first flow-through opening (7b) is in fluid connection with the second flow-through opening (8b) via the second fluid line (17b) and the deflection chamber (16).

* * * * *